(12) United States Patent
Cina et al.

(10) Patent No.: US 7,733,011 B2
(45) Date of Patent: Jun. 8, 2010

(54) ORGANIC LIGHT-EMITTING DIODE WITH RELIEF PATTERNS

(75) Inventors: Salvatore Cina, Rennes (FR); Valter Drazic, Betton (FR); Landry Chopin, Aix en Provence (FR)

(73) Assignee: Thomson Licensing, Boulogne-Billancourt (FR)

( * ) Notice: Subject to any disclaimer, the term of this patent is extended or adjusted under 35 U.S.C. 154(b) by 152 days.

(21) Appl. No.: 11/596,749

(22) PCT Filed: May 13, 2005

(86) PCT No.: PCT/FR2005/050322

§ 371 (c)(1),
(2), (4) Date: Sep. 4, 2008

(87) PCT Pub. No.: WO2005/114762

PCT Pub. Date: Dec. 1, 2005

(65) Prior Publication Data

US 2009/0072711 A1   Mar. 19, 2009

(30) Foreign Application Priority Data

May 17, 2004   (FR) .................................. 04 50956

(51) Int. Cl.
*H01J 1/62* (2006.01)
*H01J 63/04* (2006.01)

(52) U.S. Cl. ...................... 313/504; 313/506; 313/114

(58) Field of Classification Search ................ 313/504, 313/506, 512, 113; 257/40; 428/690
See application file for complete search history.

(56) References Cited

U.S. PATENT DOCUMENTS

| 6,046,543 A | 4/2000 | Bulovic et al. |
| 6,538,374 B2 * | 3/2003 | Hosokawa .................. 313/504 |
| 6,630,684 B2 * | 10/2003 | Lee et al. ...................... 257/40 |

(Continued)

FOREIGN PATENT DOCUMENTS

| EP | 0442002 | 8/1991 |
| EP | 0621500 | 10/1994 |
| JP | 2000-231985 | 8/2000 |

OTHER PUBLICATIONS

Patent Abstracts of Japan, vol. 2000, No. 11, Jan. 3, 2001 & JP 2000-231985 (See Ref. AF).
Search Report Dated Oct. 14, 2005.

*Primary Examiner*—Peter J Macchiarolo
*Assistant Examiner*—Glenn Zimmerman
(74) *Attorney, Agent, or Firm*—Robert D. Shedd; Jeffrey M. Navon

(57) ABSTRACT

The invention relates to an organic light-emitting diode comprising on a substrate, from the rear face to the front face, at least one rear electrode of a first type surmounted by an organic light-emitting layer, itself surmounted by at least one front electrode of a second type, the organic light-emitting layer producing light when holes and electrons are injected into it by a current flowing through the electrodes, the types corresponding to an anode and a cathode, at least one of the electrodes being substantially transparent for the produced light in order to allow it to escape through one of the faces of said diode, referred to as the exit face. According to the invention, said substantially transparent electrode comprises at least one transparent extraction zone and at least one reflective zone adapted to return the produced light through the light-emitting layer, and said diode also comprises reflector means which are arranged on the opposite side of said substantially transparent electrode from the organic light-emitting layer and are adapted to return the produced light to said substantially transparent electrode through the light-emitting layer. The diode may be configured by embossing, and various embodiments are described.

12 Claims, 8 Drawing Sheets

U.S. PATENT DOCUMENTS

Figure 1:
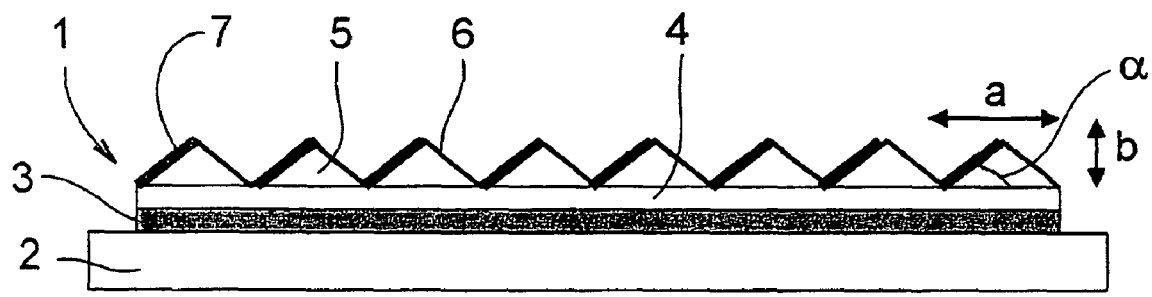

| | | | |
|---|---|---|---|
| 7,449,833 B2* | 11/2008 | Kobayashi | 313/506 |
| 2003/0015961 A1* | 1/2003 | Yamazaki | 313/504 |
| 2003/0044639 A1* | 3/2003 | Fukuda | 428/690 |
| 2003/0117067 A1* | 6/2003 | Roitman et al. | 313/504 |
| 2004/0012980 A1 | 1/2004 | Sugiura et al. | |
| 2004/0178722 A1* | 9/2004 | Cok et al. | 313/506 |
| 2007/0069642 A1* | 3/2007 | Kitai et al. | 313/511 |

\* cited by examiner

ORGANIC LIGHT-EMITTING DIODE WITH RELIEF PATTERNS

This application claims the benefit, under 35 U.S.C. §365 of International Application PCT/FR05/050322, filed May 13, 2005, which was published in accordance with PCT Article 21(2) on Dec. 1, 2005 in French and which claims the benefit of French patent application No. 0450956, filed May 17, 2004.

The present invention relates to an organic light-emitting diode (OLED) with improved light extraction and to a corresponding display unit. It has applications in the field of optoelectronics, particularly for producing signaling lights and display devices.

Organic light-emitting diodes (OLEDs) are experiencing significant development. Like the conventional light-emitting diodes (LEDs) which preceded them, they are based on the capacities possessed by certain compounds, particularly semiconductor compounds or in this case organic compounds, to emit light when, placed between electrodes, they are subjected to a current making it possible to inject charges into them, i.e. electrons and holes. A conventional organic light-emitting diode (OLED) structure comprises, on a substrate, two electrodes which are intended to inject charges of opposite sign and between which an organic layer is arranged, optionally formed by one or more sublayers. One of the electrodes, the anode which injects holes, is conventionally transparent and generally made of indium-tin oxide (ITO) so that the light can escape across said electrode through an exit face. The other electrode, the cathode which injects electrons, is for its part conventionally reflective. In the case when the light emission takes place through the substrate, which is therefore necessarily transparent, the terms downward or rearward light emission are employed. In the converse case when the emission takes place on the opposite side from the substrate, the terms upward or forward light emission are employed. Devices with rear emission are simpler to produce and more efficient owing to the fragility of the organic layer vis-à-vis the conditions necessary for producing OLED diodes, and particularly for depositing the electrodes.

In order to let the produced light pass through, the transparent electrodes should have a very small thickness, which leads to an increase in the electrical surface resistance and may impair homogeneous distribution of the current over the entire surface of the OLED diode, whence an inhomogeneity in light emission, and/or cause detrimental temperature rises by the Joule effect. A very thin electrode furthermore has inferior mechanical and environmental stability characteristics, leading to production losses and accelerated ageing. Lastly, depending on the material used to produce the very thin electrode, it may be necessary to add complementary sublayers to the structure, for example to inject or transport holes or electrons, which is disadvantageous from the economic point of view.

It is therefore necessary to find a compromise between the optical transparency of the electrode and its electrical and electronic properties, which leads to mediocre electro-optical efficiencies. Investigations have also been made in other directions so as to increase this efficiency, and in particular it has been proposed to employ structures doped with light extractors allowing a greater part of the light produced in the OLED diode to leave this diode. For instance, it has been proposed in U.S. Pat. No. 6,091,384 or in U.S. Pat. No. 6,229,160 that the produced light which is propagating or is reflected laterally should be returned to the exit face of the diode by lateral reflectors.

Organic light-emitting diodes comprise, on a substrate from the rear face to the front face, at least one so-called rear electrode surmounted by an organic light-emitting layer, itself surmounted by a so-called front electrode. Document U.S. Pat. No. 6,396,208 describes a means for improving the light extraction from such light-emitting diodes by making holes in the rear electrode, which is substantially transparent in this case, or by providing this rear electrode with protrusions; these holes or these protrusions generate a relief on the surface of this electrode which, because of the fabrication method described in this document, is replicated on the front electrode which is reflective in this case. According to this document, the surface formed by the reflective front electrode is therefore substantially parallel to the surface formed by the rear electrode. However, this means of improving the light extraction still remains insufficient. Document US 2002/079835 describes a variant of the extraction means described in U.S. Pat. No. 6,396,208.

The present invention proposes to increase the light extraction from an organic light-emitting diode (OLED) by a particular implementation of optical reflector means while, paradoxically, reducing the surface through which the light can escape from the diode. According to a particular exemplary embodiment it consists in producing a particular structure, optionally repeated, in an elementary prismatic shape with two side faces on the light exit face of the OLED diode, one of the side faces being rendered reflective. According to another particular exemplary embodiment it consists in applying reflective zones comprising bosses onto the plane surface of the front electrode. The proposed solution goes against a principle according to which the light extraction can be commensurately more efficient when there is more exit surface, through which the light can escape from the diode. Implementation of the proposed solution is moreover industrially very simple because it can employ known techniques, particularly of embossing, in order to produce the exit face of the OLED diode.

The invention therefore relates to an organic light-emitting diode (OLED) comprising, on a substrate from the rear face to the front face, at least one so-called rear electrode of a first type surmounted by an organic light-emitting layer, itself surmounted by at least one so-called front electrode of a second type, the organic light-emitting layer producing light when holes and electrons are injected into it by a current flowing through the electrodes, the electrode types corresponding to an anode and a cathode, at least one of the electrodes being substantially transparent for the produced light in order to allow it to escape through one the faces of said diode, referred to as the exit face.

According to the invention,
  said substantially transparent electrode comprises at least one transparent extraction zone and at least one reflective zone adapted to return the produced light through the light-emitting layer,
  said diode also comprises reflector means which are arranged on the opposite side of said substantially transparent electrode from the organic light-emitting layer and are adapted to return the produced light to said substantially transparent electrode through the light-emitting layer,
  the surface formed by the substantially transparent electrode with its extraction zones and its reflective zones is not approximately parallel to the surface formed by the reflector means.

When it is the rear electrode which is transparent and the produced light emerges from the diode through the rear face across the substrate, the diode is a downward emission diode.

When it is the front electrode which is transparent and the produced light emerges from the diode through the front face, the diode is an upward emission diode.

Depending on the case, the electrode of the first type is an anode and the electrode of the second type is a cathode or, conversely, the electrode of the first type is cathode and the electrode of the second type is an anode.

The term reflective zone corresponds to a part of the substantially transparent electrode, which part is intended to return the light produced by the light-emitting layer to said light-emitting layer. The term transparent extraction zone corresponds to another part of the substantially transparent electrode, which other part lets the light produced by the light-emitting layer pass out of the OLED diode. The reflector means, either consisting of the other electrode which is then a reflective electrode or being independent reflection means, are intended to return the light produced by the light-emitting layer to said light-emitting layer. There may therefore be multiple reflections in the diode before the light produced by the light-emitting layer can emerge through the extraction zones.

Said reflector means, on the one hand, the shape and the surface of the extraction zones and of the reflective zones of the transparent electrode, on the other hand, preferably are mutually adapted so that as regards the light produced by the light-emitting layer which is reflected by said reflector means, a greater proportion of this reflected light passes through the extraction zones and a lesser proportion is reflected by the reflective zones, before being "recycled" again by the reflector means. An embossed shape of the substantially transparent electrode may be adapted to this effect and, conversely, the same effect may be achieved by retaining a flat shape for the transparent electrode but by using an embossed rear electrode as reflector means.

The following means, which may be combined according to all technically feasible possibilities, are employed in various implementations of the invention:

- one or other or both of the reflector means, on the one hand, and the substantially transparent electrode with its extraction zones and its reflective zones, on the other hand, lie on at least one relief pattern, (in practice, the reflector means and the substantially transparent electrode with its extraction zones and its reflective zones are mutually configured by one or more relief patterns so that a greater proportion of the quantity of light which is produced by the light-emitting layer, and which is reflected by the reflector means, is reflected toward the extraction zones in order to be extracted than toward the reflective zones in order to be returned into the light-emitting layer; the relief patterns may be simple or, preferably, periodic and with various shapes—elementary in the case of periodicity—and in particular prismatic with faces which are straight or curved in the shape of an arc of a circle, ellipse or other nonlinear curve, or bosses)
- the relief patterns are obtained by embossing and the surface formed by the substantially transparent electrode with its extraction zones and its reflective zones is not parallel to the surface formed by the reflector means, (embossing produces one or more relief patterns, as opposed to non-embossing in which the shape is or remains substantially plane; the configuration corresponds in particular to an embossed shape of the substantially transparent electrode with its extraction zones and its reflective zones, the reflector means being for their part embossed or, preferably, not embossed; conversely, the substantially transparent electrode may be not embossed and the reflector means may be embossed)
- the reliefs have maximal amplitude of less than or equal to 2 μm, (this advantageously limits the total thickness of the diode and therefore its cost)
- the relief patterns have a maximal amplitude of less than or equal to 2 μm and greater than or equal to 0.2 μm
- the relief patterns are obtained by pressing reflective spheres,
- between the organic light-emitting layer and one and/or other of the electrodes the diode comprises a transparent organic layer whose thickness varies according to the position on the layer, which supports said electrode and forms the relief patterns, (it will be understood that in the case when the embossed transparent organic layer lies between the organic light-emitting layer and the substantially transparent electrode with its extraction zones and its reflective zones, said transparent organic layer is in correspondence with the extraction zones and the reflective zones)
- the thickness variability is greater than or equal to 200 nm, (one half wavelength in the blue range)
- the transparent organic layer is doped so that it is able to transport charges, i.e. electrons or holes depending on the case,
- the produced light escapes from the OLED diode through a set N>1 of extraction zones and the reflective zones are complementary to these extraction zones on the substantially transparent electrode,
- only one of the electrodes being substantially transparent, the other electrode referred to as the reflective electrode is reflective and forms said reflector means,
- preferably, in the case when only one of the electrodes is substantially transparent, the other electrode is reflective and forms said reflector means, this reflective electrode is metallic,
- for the reflective electrode the metal is selected as a function of the type of the electrode, for an anode the metal being selected from among gold, platinum, palladium or one of the alloys containing it or them, for a cathode the metal being selected from among aluminum, silver, chromium or one of the alloys containing it or them,
- the substantially transparent electrode with its extraction zones and its reflective zones comprises:
    - a substantially transparent conductive layer extending both over the reflective zones and over the extraction zones,
    - and, extending only over the reflective zones, a conductive reflective layer bearing on said transparent conductive layer, (the extraction zones therefore correspond to zones where there is a substantially transparent conductive layer, and the reflective zones correspond to zones where there is a substantially transparent conductive layer also surmounted by a reflective layer; the reflective layer is generally opaque and highly conductive)

- preferably, the substantially transparent conductive layer lies against the light-emitting layer or the transparent organic layer, depending on the case,
- the reflective layer of the substantially transparent electrode is metallic, the metal being selected as a function of the type of the electrode, for an anode the metal being selected from among gold, platinum, palladium or one of the alloys containing it or them, for a cathode the metal being selected from among aluminum, silver, chromium or one of the alloys containing it or them, the surface conductivity of the reflective layer is at least ten times greater than the surface conductivity of the substantially transparent conductive layer, (the reflective zones thus serve as a bus for distributing the charge carriers, i.e. electrons or holes, over the substantially transparent conductive layer and, through the latter, over the active surface of the diode)

the reflective layer has a thickness of greater than or equal to 100 nm (preferably equal to approximately 500 nm) and the substantially transparent conductive layer has a thickness of less than or equal to 10 nm, (preferably equal to approximately 5 nm)

the reflective layer of the substantially transparent electrode is lined with an additional conductive layer of a metal selected from among aluminum, silver, chromium or one of the alloys containing it or them, (in the case when the reflective layer of the substantially transparent electrode is made of the same metal or alloy as the additional conductive layer, this is equivalent to increasing the thickness of the reflective layer over at least a part of its surface)

the substantially transparent conductive layer is a carrier injection layer, (if the substantially transparent electrode is an anode the substantially transparent conductive layer is a hole injection layer, and if the substantially transparent electrode is a cathode the substantially transparent conductive layer is an electron injection layer, for example made of a material selected from among the alkali metal fluorides such as LiF or BaF2, or the alkali metals themselves such as Li or Ba)

the transparent extraction zone or zones and the reflective zone or zones of the substantially transparent electrode form alternate elongated strips, respectively extraction strips and reflective strips, (the elongated strips may be linear, circular or more generally convoluted shapes)

the transparent extraction zone or zones and the reflective zone or zones of the substantially transparent electrode form mutually parallel alternate elongated strips, respectively extraction strips and reflective strips, each strip has a constant width, the strips are substantially plane, (in the case when the substantially transparent electrode lies on a relief pattern, the strips are inclined with respect to one another and with respect to the opposite electrode on the other side of the organic layer)

the organic light-emitting diode (OLED) is such that:
the reflective electrode is substantially plane,
each of the reflective zones and the extraction zones of the substantially transparent electrode is substantially plane and inclined with respect to the reflective electrode, the sequence if these zones forming at least one elementary triangular prismatic structure whose apex edge and two side base edges are substantially parallel to the reflective electrode, the light escaping from the OLED diode through a set N>1 of extraction zones, each separated from the next by a reflective zone, these extraction zones are mutually parallel and these reflective zones are mutually parallel, the extraction zones and the reflective zones being arranged regularly on the substantially transparent electrode according to a regular periodic repetition of the elementary triangular prismatic structure, the light escaping from the OLED diode through a set N>1 of extraction zones grouped in pairs, the two extraction zones of a pair being mutually adjacent and having a common base edge and being separated from the next pair of extraction zones by a pair of mutually adjacent reflective zones having a common base edge, the pairs of extraction zones and reflective zones being arranged regularly on the substantially transparent electrode according to a regular periodic repetition of the elementary triangular prismatic structure, at least one of the elongated strips has bosses, the reflective strips comprise bosses, the bosses are made of a material compatible with those of the substantially transparent conductive layer and of the conductive reflective layers of the substantially transparent electrode, (in particular, an electrical contact is made between these materials)

the bosses are made of a pure metallic material or metal-based alloy, the bosses are made of a material which is identical to the material of the conductive reflective layers of the substantially transparent electrode, the bosses are at least reflective hemispheres and up to reflective spheres with a determined diameter D whose convex spherical part is oriented toward the organic layer, said at least hemispheres being mutually aligned and in contact along each reflective strip, the width of each reflective strip being a multiple n of D with n integer>=1, (there may be a plurality of parallel rows of bosses in a reflective strip)

each reflective strip comprises only one row of at least hemispheres, the substantially transparent conductive layer extends over the entire convex spherical part oriented toward the organic layer in each at least hemisphere, the substantially transparent conductive layer extends only over a portion of the convex spherical part oriented toward the organic layer in each at least hemisphere, (the convex spherical part indented into the organic light-emitting layer, or into the transparent organic layer if this is not present, is not covered with a substantially transparent conductive layer)

the bosses are spheres, the reflective strips comprise bosses, the bosses are at least reflective hemispheres and up to reflective spheres with a determined diameter D whose convex spherical part is oriented toward the organic layer, said at least hemispheres being mutually aligned and in contact along each reflective strip, the width of each reflective strip being a multiple n of D with n integer>=1, the bosses are spheres and n=1, the area of the diode is the sum of the total surface of the extraction zones plus the total surface of the reflective zones and the diode has a ratio of between 40 and 70 in percentage between the total surface of the extraction zones and the area, the diode furthermore comprises a redirecting optical structure which is arranged at the exit of the OLED and in relation with each extraction zone in order to orient the light extracted from the diode preferentially along an average direction substantially perpendicular to the general plane of the diode.

The invention lastly relates to an organic light-emitting diode (OLED) display unit comprising a set of diodes (OLEDs) according to one or more of the preceding characteristics.

Figure 2:
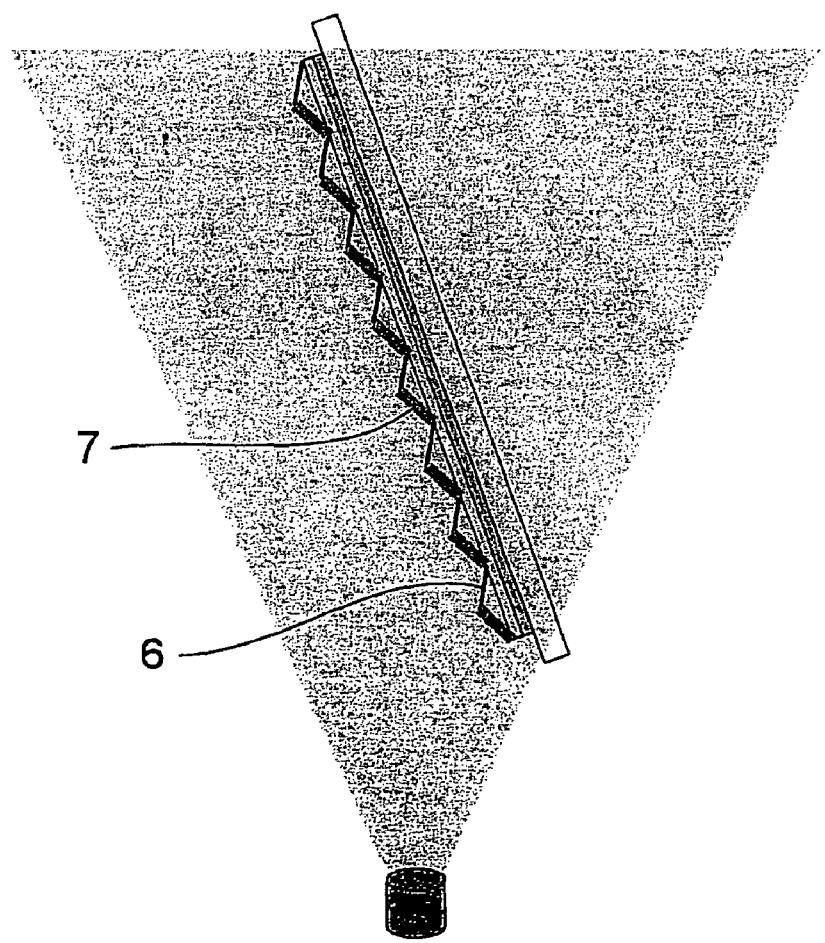
Figure 3:
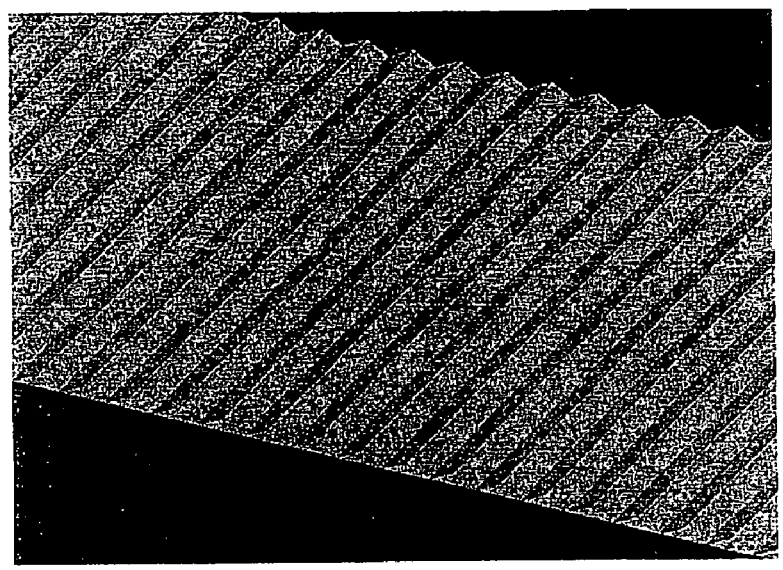
Figure 4:
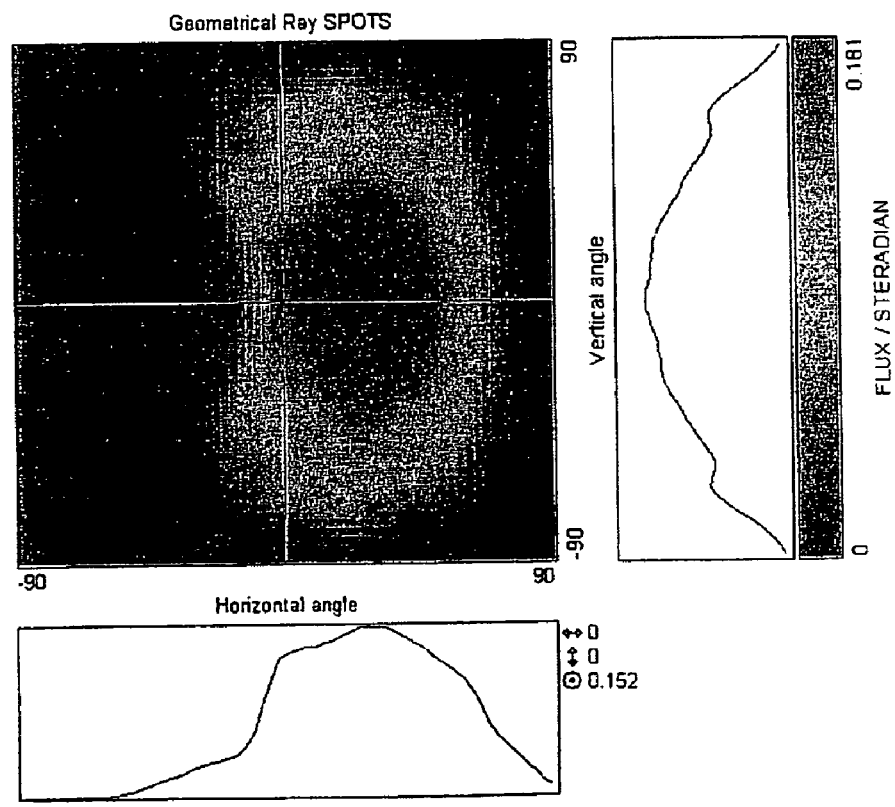
Figure 5A:
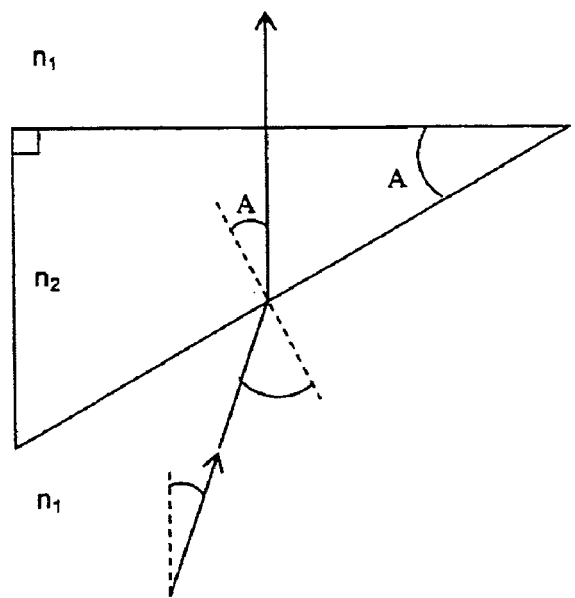
Figure 5B:
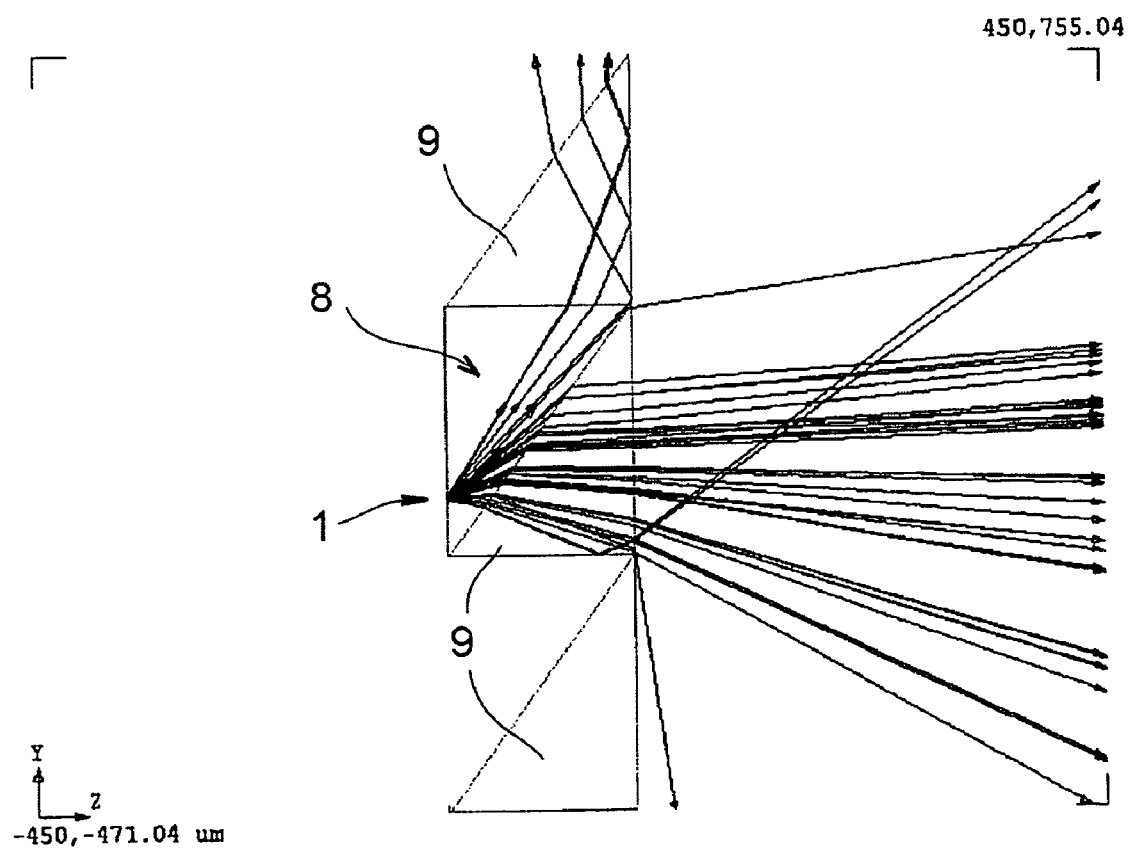
Figure 6:
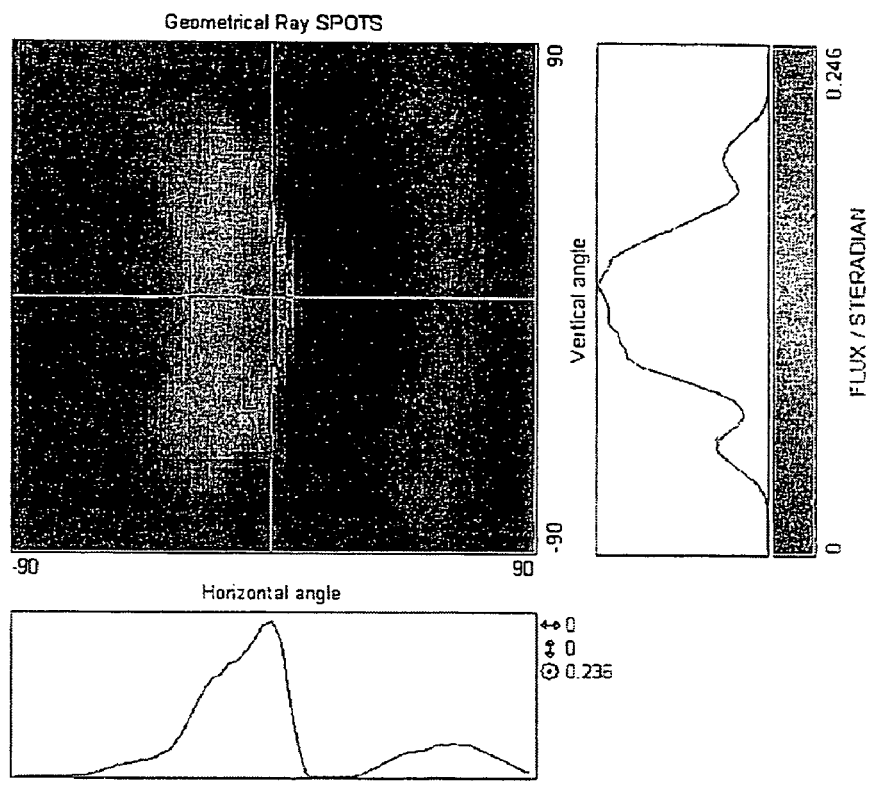
Figure 7:
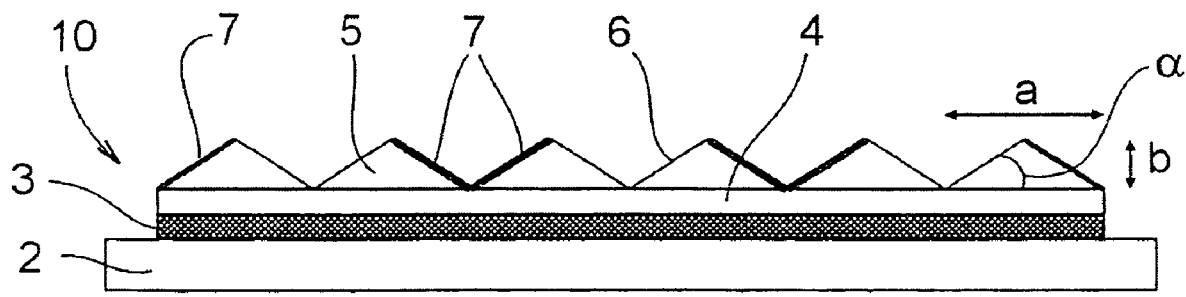
Figure 8:
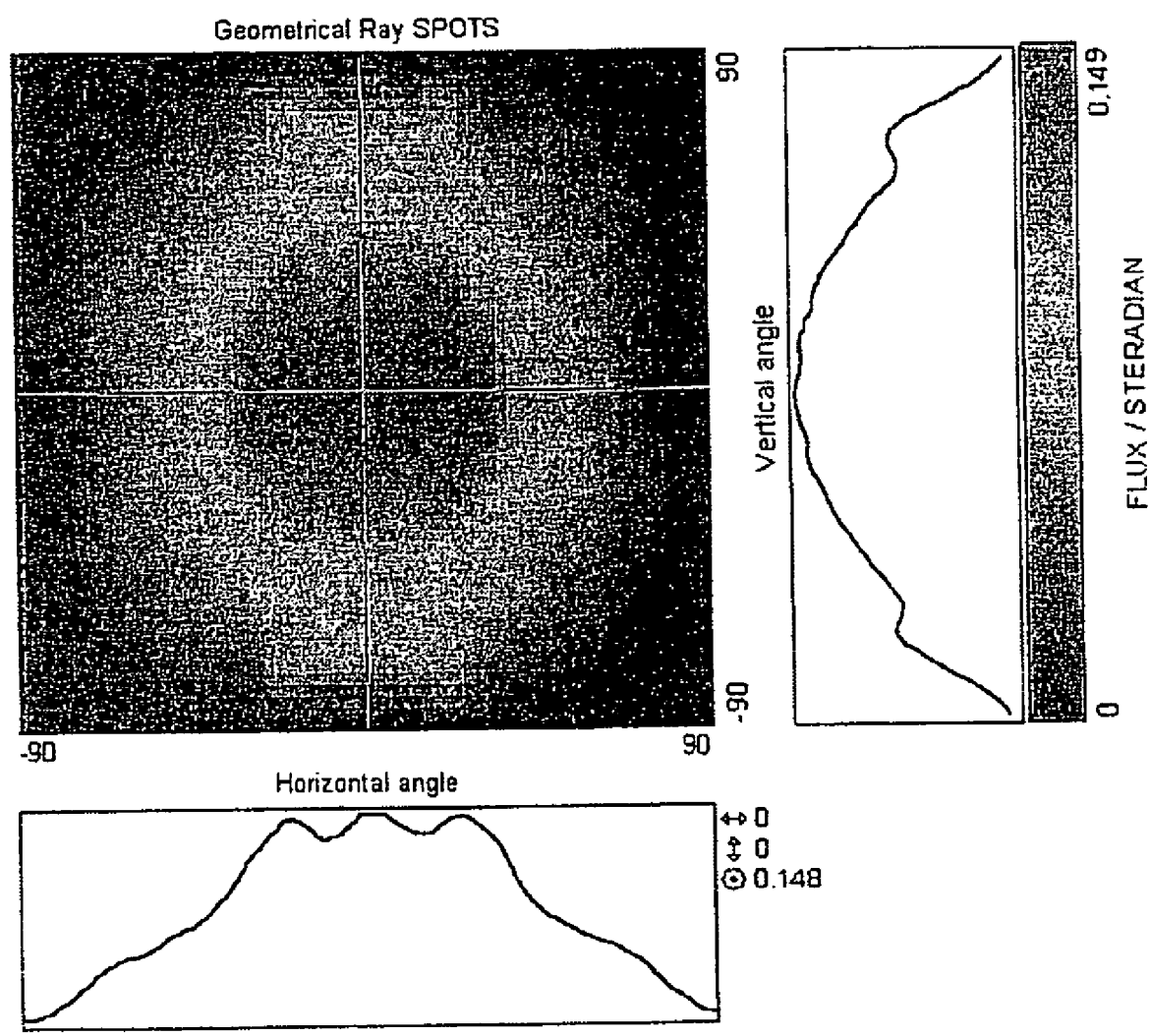
Figure 9:
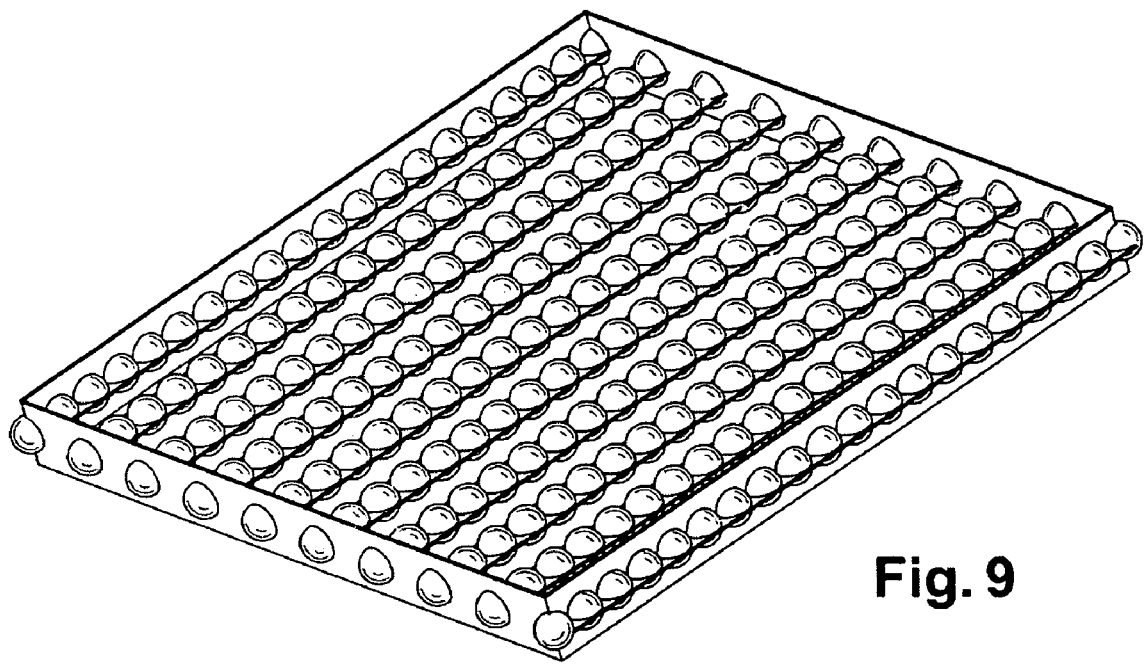
Figure 10:
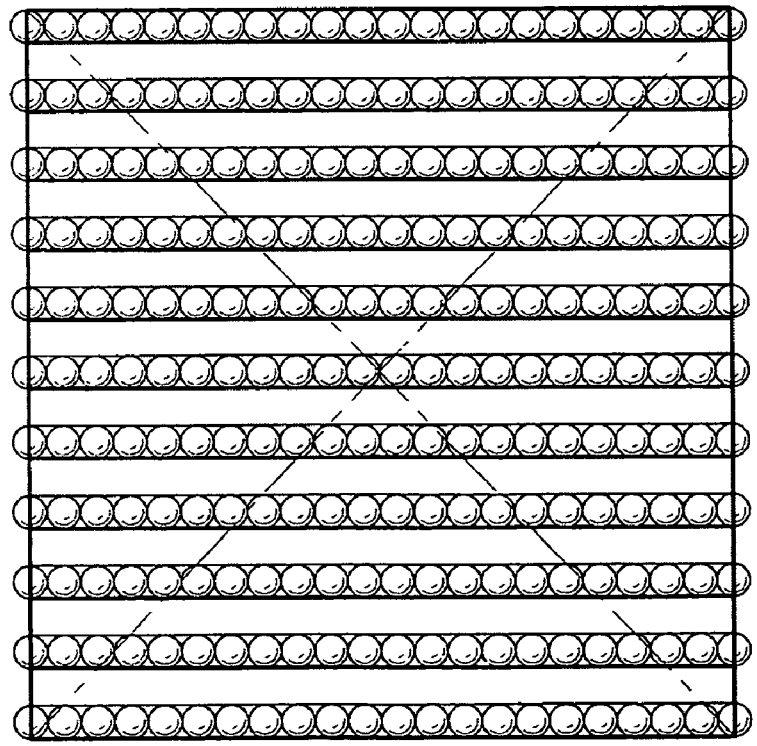
Figure 11:
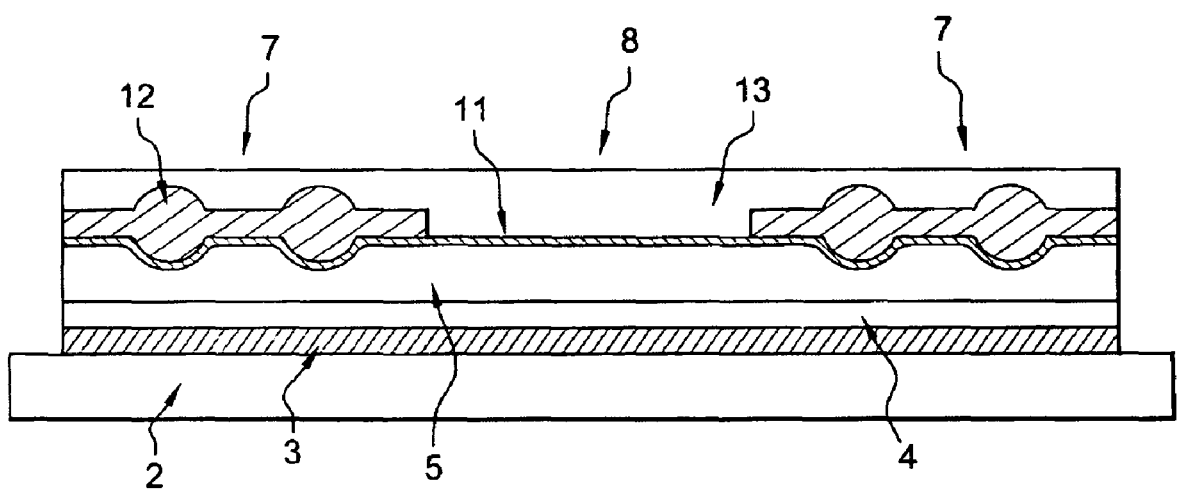
Figure 12:
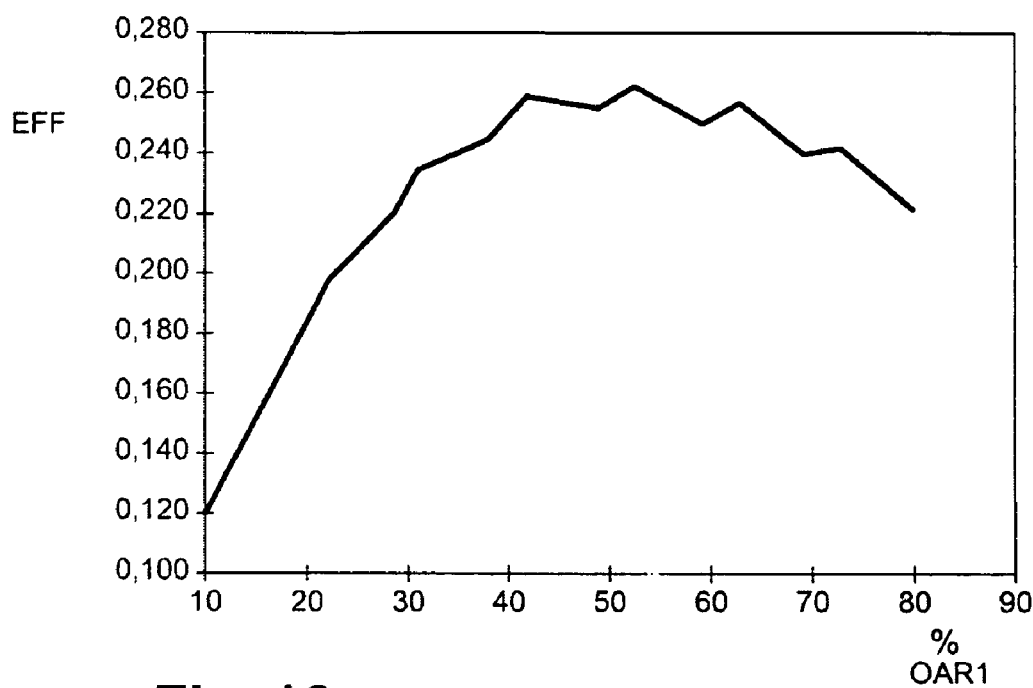
Figure 13:
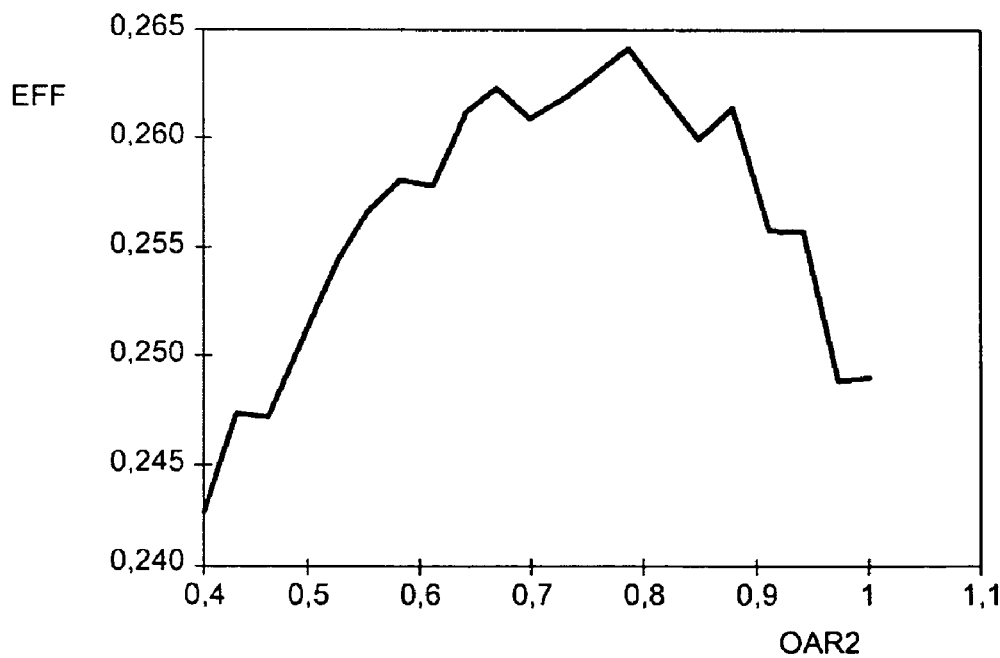

The present invention will now be exemplified with the description which follows in conjunction with the following figures, but without being limited thereby:

FIG. 1 which represents an OLED diode according to a first embodiment of the invention in cross section, FIG. 2 which represents a mode of depositing a reflective second layer in the case of an OLED diode according to the first embodiment of the invention, FIG. 3 which represents an OLED diode according to the first embodiment of the invention in a downward perspective view, FIG. 4 which represents the angular distribution of the exit light flux of an OLED diode according to the first embodiment of the invention, FIG. 5A which represents an example of a redirecting prism in cross section with calculation formulae for an OLED diode according to the first embodiment of the invention, FIG. 5B which schematically represents a simulation of the implementation of redirecting prisms on an OLED diode according to the first embodiment of the invention, FIG. 6 which represents the spatial distribution of the exit light flux of an OLED diode according to the first embodiment of the invention and with a redirecting prism, FIG. 7 which represents an OLED diode according to a second embodiment of the invention in cross section, FIG. 8 which represents the spatial distribution of the exit light flux of an OLED diode according to the second embodiment of the invention, FIG. 9 which represents a schematic perspective view of a third embodiment of the invention, FIG. 10 which represents a schematic plan view for simulation of the third embodiment of the invention, FIG. 11 which represents an OLED diode according to a third embodiment of the invention in cross section, FIG. 12 which represents the result of a simulation intended to determine the variation in the light extraction efficiency of the diode as a function of the ratio between the total surface of the extraction zones and the area of the diode, and FIG. 13 which represents the result of a simulation intended to determine the variation in the light extraction efficiency of the diode as a function of the ratio of the widths of the extraction and reflective strips.

FIG. 1 relates to an organic light-emitting diode (OLED) whose light exit face is the front face, i.e. the face on the opposite side from the substrate on which the diode is constructed. On a substrate 2 on the rear face side, the OLED diode 1 comprises at least one rear electrode 3 of a first type, anode or cathode, which also has optical reflection properties so as to be reflective toward the exit face and form the reflector means. The rear electrode 3, referred to as the reflective electrode, is metallic and is surmounted by a light-emitting organic layer 4 which may comprise sublayers. The light-emitting organic layer 4 is lastly surmounted by an embossed transparent organic layer 5 which has relief patterns arranged periodically and regularly, which patterns form elementary prismatic structures whose front surface supports a substantially transparent electrode of a second front type 6, cathode or anode respectively according to the first type. On the faces of the prismatic structures, this electrode of the second type is distributed into opaque reflective zones 7 and transparent extraction zones. The front electrode is preferably extended over the entire front face of the OLED diode. The edges of the prismatic structures are mutually parallel. The front face of the diode may be produced in the organic layer 4 or added onto the latter with a transparent organic layer 5.

The embossed layer 5 is preferably made of organic material which is doped adequately for the potential difference applied between the electrodes of the diode to generate an electric field which is approximately constant throughout the light-emitting layer zones, whatever the thickness of organic material covering this zone locally. The embossed layer 5 may also be made of conductive polymer, for example PEDOT-PSS or PANI. The surface of this embossed layer which supports the second type electrode therefore comprises a series of elementary prismatic patterns, which are preferably arranged regularly and preferably extend lengthwise over the entire surface of the emissive organic layer.

The front electrode of the second front type 6 comprises two layers:
  a very thin and conductive transparent layer with a thickness of the order of 5 nm, covering the entire surface of the embossed organic layer while matching its relief patterns, and
  thicker metallic strips with a thickness of the order of 500 nm forming the opaque reflective zones 7, these strips therefore covering only a part of the surface of the embossed organic layer, also while matching its relief patterns.

The exit face of the OLED diode therefore has an alternating sequence of reflective strips and substantially transparent strips, the reflective strips also being good conductors of electricity.

The light-emitting organic layer may consist of small molecules, polymers, dendrimers etc. or it may even be made hybrid by combining such materials, which may or may not be doped (for fluorescence and/or electrical conduction). It may also comprise sublayers, in particular sublayers for injecting, transporting and blocking charges, i.e. electrons or holes.

Several modes of producing the basic OLED diode as described above may be considered separately or in combination, particularly as a function of the type of the front 6 and rear 3 electrodes, as a function of the shape of the relief patterns, as a function of the distribution of the extraction zones and the reflective zones on the elementary prismatic structures, as a function of the shape and the dimensions of each elementary prismatic structure, as a function of the extraction side (substrate side or not), as a function of the presence or not of relief patterns on the substrate side, and optionally on both faces of the diode, all functional combinations being possible.

FIG. 1 presents a first mode relating to the distribution of the reflective second layers 7 on the elementary prismatic structures 5, in which the reflective zones are arranged systematically on the same face of the elementary prismatic structures (on the left in FIG. 1) and are therefore all mutually parallel. A constant elementary prismatic pattern is repeated as may be seen in FIG. 3, which is a downward perspective view of the OLED diode of FIG. 1. In such a mode the structure and the preferred dimensions of the elementary prismatic structure, which is symmetrically triangular (the two side faces, reflective zone 7 and extraction zone 6, have substantially equal surfaces), were determined by calculation with a=width at the base, b=height and α=base edge angle. The following approximate values were thus determined: a=4 micrometers, b=1.06 micrometers and α=28 degrees. In practice, the height b is generally less than or equal to at most 2 micrometers. This small thickness (height) of the reliefs avoids employing a large quantity of organic materials and particularly as regards the transparent organic layer, for forming the relief patterns, this type of material being particularly expensive.

The results obtained by simulation with the OLED diode according to the first mode described above and the preferred dimensions are given below. These results were obtained by using a source composed of two Lambertian sources arranged back to back, immersed in the middle of the organic layer and emitting an initial flux Fini equal to 1. A reference device (reference OLED diode) composed of the source in the organic layer surmounted by a flat glass substrate was selected for calculating the extraction gains. The following quantities (arbitrary units) are given in the tables of results:

| | |
|---|---|
| $R_{aL}$ | reflection coefficient of the aluminum coatings |
| Io | light intensity at normal observation (0°) |
| $F_{out}$ | total emerging flux |
| $F_{15}$ | emerging flux in a cone of aperture 15° |
| $F_{30}$ | emerging flux in a cone of aperture 30° |
| $F_{60}$ | emerging flux in a cone of aperture 60° |

Results for a reference OLED diode with a glass plate according to the prior art:

| $F_{ini}$ | $R_{aL}$ | Io | $F_{out}$ | $F_{15}$ | $F_{30}$ | $F_{60}$ |
|---|---|---|---|---|---|---|
| 1 | 0.85 | 0.096 | 0.296 | 0.022 | 0.079 | 0.232 |
| 1 | 0.9 | 0.100 | 0.305 | 0.022 | 0.082 | 0.239 |
| 1 | 0.95 | 0.103 | 0.313 | 0.023 | 0.084 | 0.246 |
| 1 | 1 | 0.106 | 0.322 | 0.023 | 0.086 | 0.252 |

Results for an OLED diode of the type in FIG. 1 and its preferred dimensions according to the invention:

| $F_{ini}$ | $R_{aL}$ | Io | $F_{out}$ | Gain |
|---|---|---|---|---|
| 1 | 0.85 | 0.149 | 0.421 | 1.42 |
| 1 | 0.9 | 0.167 | 0.485 | 1.59 |
| 1 | 0.95 | 0.187 | 0.579 | 1.85 |
| 1 | 1 | 0.212 | 0.788 | 2.45 |

It may be noted that the value of $R_{aL}$ has a large influence on the efficiency of the system. This is because the extraction is principally due to recycling of the light by reflection on the reflective zones of the front electrode and on the rear electrode; these may in particular be made of aluminum. The reflective surfaces of the electrodes should therefore be of the best possible quality. Assuming reflective surfaces of perfect quality (RaL=1), the light extraction gain can even reach up to 150%, whence the benefit of having good-quality reflective surfaces. With a realistic value $R_{aL}$=0.9, a gain of 1.59 i.e. 59% is obtained.

FIG. 2 represents a mode of depositing the reflective strips 7 in the case of an OLED diode according to the first embodiment of the invention as described above. After formation of the elementary prismatic structures in the embossed organic layer 5 and after deposition of the very thin transparent layer of the front transparent electrode on the entire surface of the embossed organic layer, the OLED diode being fabricated is arranged in a chamber for depositing a metal such as aluminum with optical reflection properties by sputtering/spraying. The OLED diode is inclined with respect to the sputtering/spraying direction of the metal, so that only the side faces of each elementary prismatic structure are covered with said metal. This achieves the deposition of thick metallic strips which form the reflective zones of the front electrode. The zones not covered by the metal in a strip form the extraction zones of the front electrode.

Although the above OLED diode makes it possible to obtain greatly improved light extraction, this extraction takes place in an average direction which is slightly offset (by 25 degrees) with respect to the normal to the exit face of the OLED diode, as can be seen in FIG. 4. In fact, the light intensity is maximal for an observation angle of approximately 25 degrees with respect to the normal of the OLED diode. In an improved version, therefore, it is proposed to arrange a means of the redirecting prism type on the front face for redirecting the light flux or fluxes extracted from the OLED diode, which is adapted to redirect the extracted light in an average direction normal to the exit face of the diode, which generally corresponds to an average direction normal to the general plane of the diode. Although one such redirecting means could be provided per extraction zone (the dimensions of the redirecting means then being in close relation to the dimensions of the elementary prismatic structure), it is preferable to employ a redirecting means which acts on a set of a plurality of extraction zones corresponding in practice to a "pixel" of the OLED diode.

In this latter case, the redirecting means is a prism with a length of approximately 300 micrometers and with a width of approximately 100 micrometers, which corresponds to the conventional size of a pixel of an image display unit; the height of the prism is adapted in a manner known per se so as to obtain the redirection of light as described above. In order for a light cone, which has an inclination of the average emission direction by 25 degrees with respect to the normal, to be redirected along the normal, a redirecting prism as represented in section by FIG. 5A is used which has a right-angled triangular cross section in a material with an index $n_2$ of approximately 1.5 and an angle A of approximately 35.45 degrees. These values are obtained by considering for a prism in air as represented by FIG. 5B, where an OLED diode 1 (represented in section) emits a light cone in air $n_1$=1 into the free space 8 toward the redirecting prism 9 through which the light rays preferentially emitted at 25° by the OLED diode are returned forward. In this example, the redirecting prism is therefore separated from the front face of the diode by a layer of air with index $n_1$=1. The results obtained by simulation are given below.

Results for an OLED diode of the type in FIG. 1 and its preferred dimensions and with the redirecting prism of FIG. 5B according to the invention:

| $F_{ini}$ | $R_{aL}$ | Io(gain) | $F_{out}$(gain) | $F_{15}$(gain) | $F_{30}$(gain) | $F_{60}$(gain) |
|---|---|---|---|---|---|---|
| 1 | 0.85 | 0.236 (2.44) | 0.254 (0.86) | 0.034 (1.59) | 0.091 (1.15) | 0.196 (0.84) |
| 1 | 0.9 | 0.271 (2.72) | 0.290 (0.95) | 0.039 (1.78) | 0.104 (1.27) | 0.223 (0.93) |
| 1 | 0.95 | 0.317 (3.08) | 0.336 (1.07) | 0.046 (2.01) | 0.119 (1.42) | 0.257 (1.05) |
| 1 | 1 | 0.383 (3.61) | 0.404 (1.26) | 0.054 (2.32) | 0.140 (1.62) | 0.306 (1.21) |

Still assuming $R_{aL}$=0.9, the total flux gain is close to 1. If a narrower cone of 15° is considered, the gain then reaches 1.78 and even 2.72 for the normal intensity. The radiation of the OLED diode with a redirecting prism is therefore more directional, as shown by FIG. 6. With an OLED diode as described and a directing prism, approximately 40% of the flux is lost and extraction characteristics similar to the OLEDs of the prior art are therefore encountered. In this case, however, a gain of 170% is obtained for the normal light intensity because the exit radiation is highly directional.

FIG. 7 presents a second mode of OLED diode 10 relating to the distribution of the reflective zones 7 on the elementary prismatic structures 5, in which the reflective zones are arranged systematically in pairs, i.e. by combinations of two adjacent reflective strips which therefore have a common border corresponding to a common base edge of two adjacent elementary prismatic structures. The extraction zones 6 are also combined in pairs, as represented. As before, a constant elementary prismatic pattern is repeated periodically, although the extraction zones 6 and reflective zones 7 are arranged differently i.e. in pairs, as explained above. At the side ends of the OLED diode, the side faces toward the outside of the OLED diode preferably have reflective zones 7. It will nevertheless be understood that the side ends could have other arrangements of extraction zones and/or reflective zones according to the total number of elementary prismatic structures of the OLED diode.

In such a mode the structure and the preferred dimensions of the elementary prismatic structure, which is symmetrically triangular (the two side faces have substantially equal surfaces), were determined by calculation with a=width at the base, b=height and α=base edge angle. The following approximate values were thus determined: a=4 micrometers, b=1.40 micrometers and α=35 degrees. In practice, the height b is generally less than or equal to at most 2 micrometers.

The results obtained by simulation with the OLED diode according to the second mode described above and the dimensions determined are given below. These following results were obtained by using a source composed of two Lambertian sources arranged back to back, immersed in the middle of the organic layer and emitting an initial flux Fini equal to 1. A reference device (reference OLED diode) composed of the source in the organic layer surmounted by a glass substrate was selected for calculating the extraction gains. The following quantities (arbitrary units) are given in the tables of results:

$R_{aL}$ reflection coefficient of the aluminum coatings
Io light intensity at normal observation (0°)
$F_{out}$ total emerging flux
$F_{15}$ emerging flux in a cone of aperture 15°
$F_{30}$ emerging flux in a cone of aperture 30°
$F_{60}$ emerging flux in a cone of aperture 60°

Results for a reference OLED diode with a glass plate:

| $F_{ini}$ | $R_{aL}$ | Io | $F_{out}$ |
|---|---|---|---|
| 1 | 0.9 | 0.100 | 0.305 |
| 1 | 0.95 | 0.103 | 0.313 |

Results for an OLED diode of the type in FIG. 7 and its preferred dimensions according to the invention:

| $F_{ini}$ | $R_{aL}$ | Io (gain) | $F_{out}$ (gain) |
|---|---|---|---|
| 1 | 0.9 | 0.145 (1.45) | 0.446 (1.46) |
| 1 | 0.95 | 0.167 (1.65) | 0.547 (1.75) |

It may be noted that the value of $R_{aL}$ has a large influence on the efficiency of the system. This is because the extraction is principally due to recycling of the light by reflection on the reflective layers or strips, particularly made of aluminum. The reflective layers should therefore be of the best possible quality. With a realistic value $R_{aL}$=0.9, a gain of 46% is obtained for the integral flux and 45% for the normal intensity.

The angular distribution of the exit light flux of the OLED diode is given in FIG. 8, where it can be seen that the emitted energy is maximal at the normal and decreases moderately and symmetrically when the observation angle increases, which is entirely favorable for display applications.

The methods and materials employed for producing the OLEDs of the prior art may partly be used for producing the OLEDs according to the invention. The production of the front and/or rear face of the OLED diode, however, will be different in order to obtain the elementary prismatic structure or structures, on the one hand, and the reflective strips, on the other hand. For these prismatic structures, it may resort to embossing techniques; for the reflective strips, it may resort to techniques for the differential deposition of materials, in particular metal.

From the rear face to the front face of the OLED diode, there are the following:

A substrate 2 which may be of any type compatible with the other materials employed, and which may or may not be transparent owing to the upward extraction of light here. Examples of substrates which may be considered are silicon, particularly in the case of active matrix diodes, plastics and glass.

The reflective rear electrode 3 arranged on the substrate is preferably metallic, for example made of aluminum, silver, gold, chromium, copper or alloys containing these. In the case when the rear electrode type is an anode, an additional layer of a material with a high work function such as Pt, Pd, NiCr or a compatible equivalent is preferably deposited on a metallic first layer of high conductivity. The rear electrode then has good reflectivity.

A layer 4 of a light-emitting organic material is subsequently deposited; sublayers may be created within the material. The various layers deposited so far are of regular thickness, and therefore have parallel opposite faces.

Next, as indicated, the embossed layer 5 is preferably produced by adding material onto the organic light-emitting layer 4. Thus, in order to form the embossed layer 5, a layer of an N-type doped (N-doped) transparent organic material is deposited on the layer 4 of light-emitting organic material and is processed, particularly by embossing, in order to form the elementary prismatic structures. The embossed layer 5 does not therefore have a regular thickness. Without thereby excluding other types of materials, the use of a doped transparent organic material in order to produce the embossed layer advantageously makes it possible to ensure a constant electric field in the light-emitting organic layer 4 and to avoid an increase in the working voltage and the emission uniformity defects of the OLED.

The substantially transparent front electrode 6 is subsequently deposited on the embossed layer 5. In order to do this in the case of a front electrode of the cathode type, a electron injection sublayer with a small thickness (approximately from 0.1 to 5 nanometers) of an alkali metal fluoride such as LiF or alkaline earth metal fluoride such as BaF2, or another equivalent product, is deposited uniformly and regularly on the entire surface of the embossed layer in order to be used for injecting electrons into the diode. Furthermore, another sublayer (thickness approximately lying between 5 and 20 nanometers) of a material with a low work function, particularly Ca, Yb, may be deposited in relation with the previous deposition of the fluoride or equivalent. Instead of an electron injection sublayer and another sublayer of a material with a low work function, other transparent conductive materials may be envisaged in order to produce a cathode, e.g. metallic materials or transparent conductive oxides such as indium tin oxide: ITO or indium zinc oxide: IZO.

Lastly, one or more reflective conductive strips 7 are subsequently produced on the selected side faces of the elementary prismatic structures, as a function of the embodiment selected (FIG. 1 or FIG. 7, or even other distributions). As indicated above it is possible to use deposition of metallic layers, for example of aluminum, silver, gold, chromium or alloys containing these. The thickness of these layers is high enough to obtain the desired reflective and conductive properties.

Note that in the case when the types of the electrodes are reversed within the OLED diode, the additional layers of materials with low/high work function are reversed and, in the case when an additional layer is used, the embossed layer is obtained by depositing a P-type (P-doped) organic material.

The light which is produced within the organic material of the OLED diode and is directed toward an extraction zone will leave the OLED diode directly. For the other directions, on the other hand, the light can be reflected by the reflective rear electrode 3 and the reflective strips 7 (reflective zones) of the front electrode toward an extraction zone of the front electrode. Note that the rear electrode 3 and the reflective strips 7 are not parallel. Virtually all the light produced within the OLED diode (neglecting the re-absorptions and imperfections of the materials) will be able to be extracted from the OLED diode through the extraction zones across the transparent front electrode.

The exemplary embodiments which have been given so far relate to diodes in which the transparent extraction zones and the reflective zones of the substantially transparent electrode form alternating and mutually parallel plane elongated strips of constant width, respectively extraction strips and reflective strips. The extraction strips and the reflective strips are not coplanar, since they form prismatic structures. In a third embodiment, the invention may also be implemented with extraction zones and reflective zones which conversely are coplanar, but where the reflective zone is not plane but comprises bosses. These bosses correspond to reflective hemispherical convex structures which are oriented toward the light-emitting organic layer so that, directly or by multiple reflections, they can reflect toward said layer the light rays which it produces and which have not passed through the extraction zones. These light rays will thus be able to reach the reflector means (for example a reflective cathode) on the opposite side from the substantially transparent electrode in order to be returned. These bosses per se may be hemispherical (hemispheres) or up to being spherical (complete spheres), so long as a hemispherical part of the boss, i.e. the inwardly curved path, is well oriented toward the light-emitting organic layer. These bosses are therefore in relation with the conductive reflective layer of the reflective zone and preferably made of the same metallic material, or at least of a compatible material, at least in order to permit the flow of current through said layer and the bosses as well as structural stability of the diode over time.

FIG. 9 gives a particular implementation of this third embodiment with reflective strips each comprising a line of aligned spherical bosses, which are mutually contiguous. The bosses have identical diameters D. The width of each reflective strip, and therefore of the conductive reflective strip, corresponds to the diameter of the bosses.

FIG. 10 is a schematic plan view representation of the diode in FIG. 9, intended for carrying out numerical simulations in order to be able to determine the widths of the transparent extraction strips (substantially transparent conductive layer) and reflective strips (conductive reflective layer against the substantially transparent conductive layer).

The diode of FIG. 11 is produced on a substrate 2, for example of glass, silicon or another compatible material. A reflective metallic rear electrode 3 of substantially uniform thickness is arranged on the substrate 2 in order to form the reflector means. Placed on this rear electrode 3 is a layer of a light-emitting organic layer 4 of substantially uniform thickness (preferably comprising sublayers). Deposited on the light-emitting organic layer 4 there is a substantially thick layer of a doped organic material 5 or of a conductive polymer material, forming a transparent and conductive organic layer whose thickness varies according to the position and which is surmounted by a substantially transparent electrode (front electrode) comprising extraction zones 8 (strips in this example) and reflective zones 7. The extraction zones 8 of the substantially transparent electrode are formed by a substantially transparent conductive layer 11, for example metallic or made of ITO or LiF—Ca as already described in the previous examples. The reflective zones 7 of the substantially transparent electrode are formed by a reflective conductive layer 12 comprising reflective spheres (preferably mutually contiguous for enhanced luminous efficiency) surmounting the substantially transparent conductive layer 11. The substantially transparent conductive layer is continuous, as represented in FIG. 11. A transparent covering layer 13, for example of SiO or $SiO_2$, allows the assembly to be protected.

In order to produce such a diode, the following steps may be used on the basis of a structure which can be produced conventionally and which, on the substrate 2, already comprises the rear electrode 3, the light-emitting organic layer 4, the doped transparent organic layer 5 and the substantially transparent conductive layer 11. A layer of a photosensitive resin is deposited on the substantially transparent conductive layer 11, and strips are produced therein by masking and exposure to remove the resin in a series of parallel strips with thickness of a few μm. These strips without resin will correspond to the reflective zones. Metallic spheres with a diameter of a few μm are deposited in these strips and pressed against the structure, so that they are indented into said structure by approximately 10 to 50% of their diameter. Metal (for example Al, Cr etc.) is subsequently deposited in order to form the rest of the conductive reflective layer and electrically connect the spheres of a given reflective strip together, the resin being removed with the rest of the deposited metal. A transparent covering layer 13 of SiO, $SiO_2$ etc. is then deposited in order to encapsulate the diode. Alternatively, such a diode with hemispherical patterns may be produced by embossing a template comprising hemispherical patterns which deform the surface of the structures in the strips where the resin has been removed. The surface of the structure then comprises at least partly hemispherical hollows (20 to 100% of a hemisphere) which will be filled during the metal deposition in order to form the conductive reflective layer.

In order to optimize the diode according to this third embodiment, simulations were carried out with software named ASAP®. It was shown that the spheres (or at least hemispheres) were the most efficient among all the possible shapes (pyramidal etc.) of bosses of the conductive reflective layer. In the case of strips each comprising a single line of contiguous spheres, furthermore, an optimum light extraction efficiency (EFF) could be determined from an efficiency/ratio curve (OAR1) between the total surface of the extraction zones and the area of the diode (the area of the diode is the sum of the total surface of the extraction zones plus the total surface of the reflective zones). The curve EFF/OAR1 is represented in FIG. 12. For a maximum light efficiency, the ratio OAR1 lies between 40 and 70 as a percentage, and is preferably about 53. It is observed that the extraction efficiency EFF varies little when the ratio OAR1 remains in this range of values. Advantageously, the extraction means according to the invention is therefore not very sensitive to fluctuations in the fabrication method which could vary the ratio OAR1. However, since the width of the extraction and reflective strips for a given ratio (OAR1) is arbitrary, the width of the strips was also determined by a process of optimization by simulation. The curve represented by FIG. 13 gives the extraction efficiency (EFF) as a function of the ratio (OAR2) of the widths of the extraction and reflective strips for a given value OAR1 corresponding to the optimum determined previously. It is found that the optimum of the ratio of the widths of the strips lies between 0.75 and 0.85, the extraction strip (zone) needing to be wider than the reflective strip (zone). An extraction gain G=0.26/0.17 of 53% as a percentage is obtained in such a case (assuming the case of an isotropic source).

The examples which have been given above are not limiting, and other alternatives may be envisaged in the scope of the invention. In particular, although extraction zones and reflective zones which are substantially plane but form a prismatic structure between them, or extraction zones and reflective zones which are coplanar but with reflective zones comprising bosses have been considered in the preferred embodiments, it may be envisaged that one or both of them may be curved, this curved shape possibly allowing more specific optical effects to be obtained (for example a mirror which is parabolic toward the interior of the diode and/or toward the exterior of the diode). The technique employed, particularly embossing, allows particular shapes of the front face and/or rear to be obtained simply. Moreover the reflective rear layer 3, which is described as preferably being an electrode (a reflective metal is a good conductor), may be independent of the rear electrode. Likewise, the rear reflective layer may be omitted if the substrate is itself optically reflective. Similarly, the reflective layers may be produced by implementing a stack of dielectric layers (dielectric mirrors) rather than monolithic metal deposition.

The invention claimed is:

1. An organic light-emitting diode comprising on a substrate, from the rear face to the front face, at least one rear electrode of a first type surmounted by an organic light-emitting layer, surmounted by at least one front electrode of a second type, the organic light-emitting layer producing light when holes and electrons are injected into it by a current flowing through the electrodes, the electrode types corresponding to an anode and a cathode, at least one of the electrodes being semi-transparent for the produced light in order to allow it to escape through one of the faces of said diode, referred to as the exit face, said semi-transparent electrode comprising at least one transparent extraction zone and at least one reflective zone adapted to return the produced light through the light-emitting layer;

said diode else comprising reflector means which are arranged on the opposite side of said semi-transparent electrode from the organic light-emitting layer and for returning the produced light to said semi-transparent electrode through the light-emitting layer;

wherein the reflector means, and the semi-transparent electrode sit on relief patterns;

the organic light-emitting diode comprising, between the organic light-emitting layer and said semi-transparent electrode and adjacent to said semi-transparent electrode, a transparent organic layer whose thickness varies alone its interface with said semi-transparent electrode such as to said relief patterns and such that the surface of the interface between this semi-transparent electrode and this transparent organic layer is not-parallel to the surface of reflection of the reflector means;

wherein the transparent organic layer is able to transport charges;

wherein the thickness variability of said transparent organic layer is greater than or equal to 200 nm; and wherein the semi-transparent electrode with its extraction zones and its reflective zones comprises:

a substantially transparent conductive layer extending both over the reflective zones and over the extraction zones, and, extending only over the reflective zones, a conductive reflective metallic layer adjacent to said transparent conductive layer, wherein said reflective layer has a surface conductivity at least ten times greater than the surface conductivity of the substantially transparent conductive layer.

2. The organic light-emitting diode as claimed in claim 1, wherein the relief patterns have a maximal amplitude of less than or equal to 2 μm and greater than or equal to 0.2 μm.

3. The organic light-emitting diode as claimed in claim 1, wherein the produced light escapes from the OLED diode through a set N>1 of extraction zones, and wherein the reflective zones are complementary to these extraction zones on the semi-transparent electrode.

4. The organic light-emitting diode as claimed in claim 1, wherein only one of the electrodes being semi-transparent, and the other electrode, referred to as a reflective electrode, is reflective and forms said reflector means.

5. The organic light-emitting diode as claimed in claim 4, wherein the transparent extraction zone and the reflective zone of the semi-transparent electrode form alternate elongated strips, respectively extraction strips and reflective strips.

6. The organic light-emitting diode as claimed in claim 5, wherein:

the reflective electrode is appreciably flat, and each of the reflective zones and the extraction zones of the semi-transparent electrode is appreciably flat and inclined with respect to the reflective electrode, the sequence of these zones forming at least one elementary triangular prismatic structure whose apex edge and two side base edges approximately parallel to the reflective electrode.

7. The organic light-emitting diode as claimed in claim 6, wherein the light from the OLED diode through a set N>1 of extraction zones, each separated from the next by a reflective zone, the extraction zones are mutually parallel and the reflective zones are mutually parallel, the extraction zones and the reflective zones being arranged regularly on the semi-transparent electrode according to a regular periodic repetition of the elementary triangular prismatic structure.

8. The organic light-emitting diode as claimed in claim 6, wherein the light escapes from the OLED diode through a set N>1 of extraction zones grouped in pairs, the two extraction zones of a pair are mutually adjacent and have a common base edge and are separated from the next pair of extraction zones by a pair of mutually adjacent reflective zones having a common base edge, the pairs of extraction zones and reflective zones being arranged regularly on the semi-transparent electrode according to a regular periodic repetition of an elementary triangular prismatic structure.

9. The organic light-emitting diode as claimed in claim 5, wherein the reflective strips comprise bosses, the bosses are at least reflective hemispheres with a determined diameter D whose convex spherical part is oriented toward the organic layer, said hemispheres being mutually aligned and in contact along each reflective strip, the width of each reflective strip being a multiple n of D width and where n is an integer >=1.

10. The organic light-emitting diode as claimed in claim 9, wherein the bosses are spheres and in that n=1.

11. The organic light-emitting diode as claimed in claim 10, wherein the area of the diode is the sum of the total surface of the extraction zones plus the total surface of the reflective zones, and in that the diode has a ratio of between 40 and 70 in percentage between the total surface of the extraction zones and the area.

12. The organic light-emitting diode as claimed in claim 5, further comprising a redirecting optical structure which is arranged at the exit of the OLED diode and in relation with each extraction zone in order to orient the light extracted from the diode preferentially along an average direction approximately perpendicular to the general plane of the diode.

* * * * *